(12) United States Patent
Cai et al.

(10) Patent No.: US 10,192,840 B2
(45) Date of Patent: Jan. 29, 2019

(54) BALL PAD WITH A PLURALITY OF LOBES

(71) Applicant: Intel Corporation, Santa Clara, CA (US)

(72) Inventors: Yuhong Cai, Folsom, CA (US); Mao Guo, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/866,640

(22) Filed: Sep. 25, 2015

(65) Prior Publication Data

US 2017/0092608 A1   Mar. 30, 2017

(51) Int. Cl.
*H01L 23/48* (2006.01)
*H01L 23/00* (2006.01)
*H01L 23/498* (2006.01)

(52) U.S. Cl.
CPC ........ *H01L 24/14* (2013.01); *H01L 23/49838* (2013.01); *H01L 23/49816* (2013.01); *H01L 23/49894* (2013.01); *H01L 2224/1405* (2013.01); *H01L 2224/145* (2013.01); *H01L 2224/1412* (2013.01)

(58) Field of Classification Search
CPC ......... H01L 24/14; H01L 24/04; H01L 24/15; H01L 24/05; H01L 23/48
See application file for complete search history.

(56) References Cited

U.S. PATENT DOCUMENTS

| | | | |
|---|---|---|---|
| 6,734,570 B1 * | 5/2004 | Archer | H01L 23/49811 257/786 |
| 6,762,503 B2 * | 7/2004 | Lee | H01L 24/13 257/780 |
| 7,115,819 B1 * | 10/2006 | Rumsey | H01L 23/49811 174/261 |
| 7,271,484 B2 * | 9/2007 | Reiss | B23K 3/0638 257/738 |
| 2006/0131758 A1 | 6/2006 | Dao | |

(Continued)

FOREIGN PATENT DOCUMENTS

JP   2005129663 A   5/2005

OTHER PUBLICATIONS

"International Application Serial No. PCT/US2016/048469, International Search Report dated Nov. 18, 2016", 3 pgs.

(Continued)

*Primary Examiner* — Michael Lebentritt
*Assistant Examiner* — Suberr Chi
(74) *Attorney, Agent, or Firm* — Schwegman Lundberg & Woessner, P.A.

(57) ABSTRACT

In some forms, an electronic assembly includes a substrate; and a ball pad mounted on the substrate, wherein the ball pad includes a plurality of lobes projecting distally from a center of the ball pad. In some forms, he electronic assembly includes a substrate; and a ball pad mounted on the substrate, wherein the ball pad includes a lobe projecting distally from a center of the ball pad. In some forms, the electronic assembly includes a substrate; and a ball pad mounted on the substrate, wherein the ball pad includes at least one lobe projecting distally from a center of the ball pad; and an electronic package that includes at least one conductor that electrically connects the ball pad on the substrate to the electronic package.

20 Claims, 6 Drawing Sheets

(56) References Cited

U.S. PATENT DOCUMENTS

| | | |
|---|---|---|
| 2008/0093749 A1 | 4/2008 | Gerber et al. |
| 2009/0133902 A1* | 5/2009 | Kim .................. H05K 1/111 |
| | | 174/250 |
| 2009/0236736 A1* | 9/2009 | Lee .................. H01L 21/561 |
| | | 257/723 |
| 2013/0015592 A1* | 1/2013 | Kelkar ................ H01L 24/05 |
| | | 257/786 |
| 2013/0168132 A1 | 7/2013 | Lee et al. |
| 2015/0001717 A1 | 1/2015 | Karhade et al. |
| 2015/0034365 A1 | 2/2015 | Nishioka et al. |
| 2015/0287685 A1* | 10/2015 | Sarihan ................ H01L 24/05 |
| | | 257/774 |

OTHER PUBLICATIONS

"International Application Serial No. PCT/US2016/048469, Written Opinion dated Nov. 18, 2016", 8 pgs.

\* cited by examiner

BALL PAD WITH A PLURALITY OF LOBES

BACKGROUND

Conventional ball grid array (BGA) electronic packages typically experience substrate trace crack failure after temperature cycling in certain applications. The substrate trace crack failure is often significant enough to pose a reliability risk to BGA electronic packages. One specific example relates to when memory BGA package are mounted onto very stiff printed circuit boards (PCBs).

Existing BGA ball pads have a round shape. The round shape of the BGA ball pads creates a tangential crack at the ball pad edge when the BGA ball pads are exposed to stress. Failure analysis shows that cracks in the substrate core material and/or solder mask are formed tangential to the edge of the round BGA ball pad.

Prior attempts to address substrate trace crack problems include (i) using low coefficient of thermal expansion substrate materials; (ii) designing wider traces at critical routing locations; and (iii) implementing larger diameter glass fiber materials in substrates in order to enhance substrate mechanical properties. However, these previous solutions usually only serve to block (not eliminate) the crack propagation that is commonly caused by stressing the BGA ball pads. In addition, each of these prior solutions typically has other limitations (e.g., cost and/or inhibition of high volume manufacturing).

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The ball grid array ball pads described herein utilize a lobed pad so that the edge of the ball pad is not a continuous circle. The lobed ball pads described herein may reduce the possibility of initiating tangential cracks at the edge of the ball pad. The potential to reduce tangential cracks at the edge of the ball pad may prevent any substrate trace cracking problems within ball grid array packages that include the ball pads.

Figure 1:
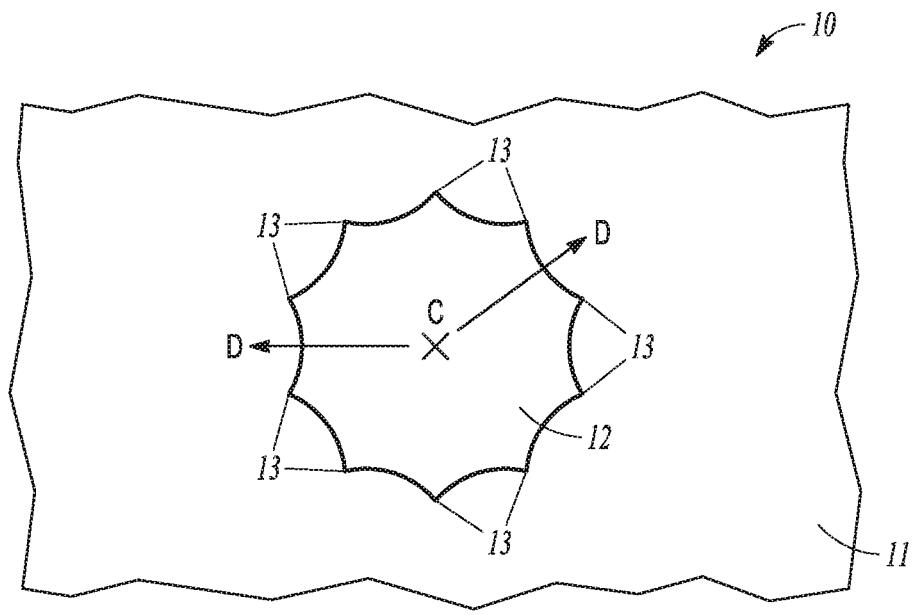
FIG. 1 is a top view illustrating an example electronic assembly that includes a substrate and a ball pad.
Figure 2:
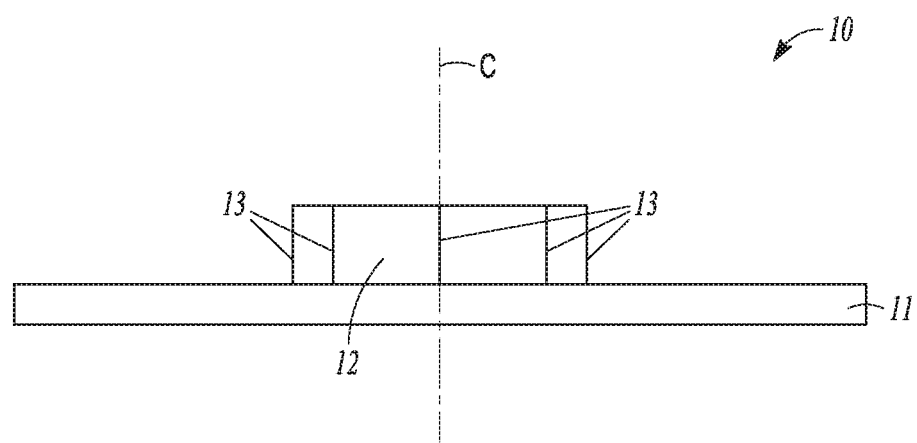
FIG. 2 is a side view of the example electronic assembly shown in FIG. 1.

FIG. 1 is a top view illustrating an example electronic assembly 10 that includes a substrate 11 and a ball pad 12. FIG. 2 is a side view of the sample electronic assembly 10 shown in FIG. 1.

The electronic assembly 10 includes a substrate 11 and a ball pad 12 mounted to the substrate 11. A ball pad 12 includes a plurality of lobes 13 that project distally D from a center C of the ball pad 12.

In some forms, the substrate is part of a printed circuit board. In other forms, the substrate is part of an electronic package. It should be noted that the type of substrate 11 that is included in the electronic assembly 10 will depend in part on the application where the electronic assembly 10 is to be used. Any substrate that is known now, or discovered in the future, may be used as part of the electronic assembly 10.

The ball pad 12 may be formed of any type of conductive material. As an example, the ball pad may be formed of copper. Other example materials that may be used for the ball pad 12 include kovar, C-194 copper-alloy (among other materials).

Figure 3:
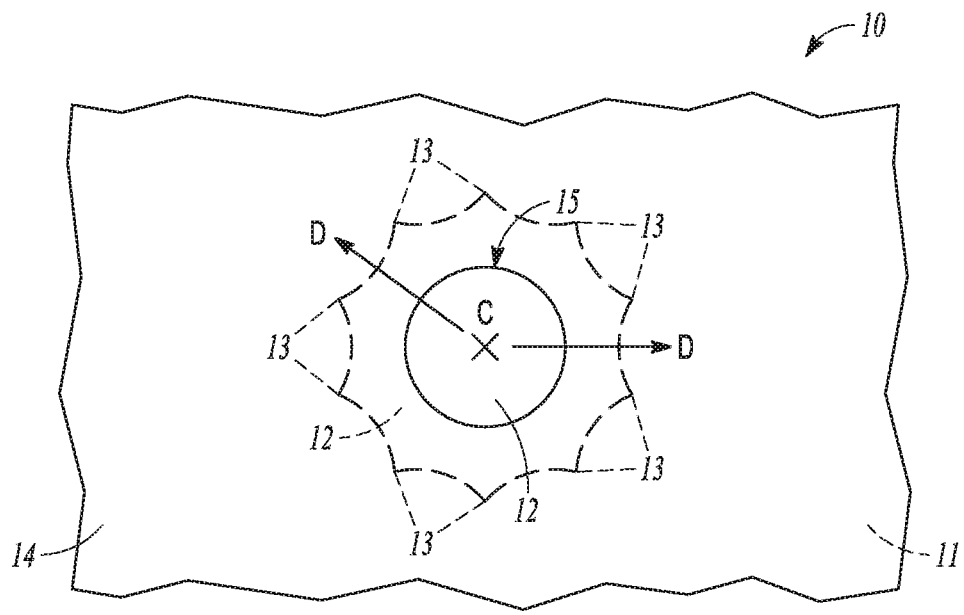
FIG. 3 is a top view of the example electronic assembly shown in FIG. 1 after a solder resist has been added.
Figure 4:
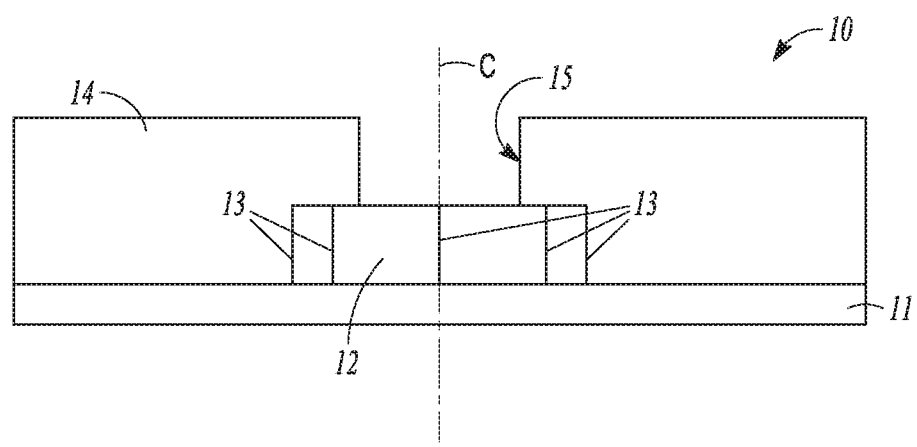
FIG. 4 is a side view of the example electronic assembly shown in FIG. 3.

As shown in FIGS. 3 and 4, the electronic assembly 10 may further include a solder resist 14 that covers the substrate 11 and a portion of the ball pad 12. In the example form that is illustrated in FIGS. 3 and 4, the solder resist 14 includes a circular opening 15 such that the ball pad 12 is exposed through the circular opening 15.

In some forms, the solder resist 14 is formed of one or more types of resin. It should be noted that the solder resist 14 may be any type of solder resist that is known now, or discovered in the future. Other example types of solder resist include, but are not limited to, PFR-800 AUS410, PSR-4000 AUS320 (among other materials).

The electronic assembly 10 may further include an additional conductor (not shown) mounted on the ball pad 12 within the circular opening 15. As an example, the additional conductor may be a combination of nickel and gold. It should be noted that a variety of different materials are contemplated for the additional conductor. The type of additional conductor that is included in the electronic assembly 10 will depend in part on the application where the electronic assembly 10 is to be used as well as the manufacturing processes that are associated with fabricating the electronic assembly 10. Other materials that may be used for the additional conductor include, but are not limited to, various combinations of nickel, platinum and gold, tin only or gold only (among other materials).

In other forms, the electronic assembly 10 may further include an organic material (not shown) that is mounted on the ball pad 12 within the circular opening 15. As an example, the organic material may be Benzimidazole or Phenylimidazole (among other potential materials). It should be noted that a variety of different types of organic materials are contemplated. The type of organic material that is utilized will depend in part on the application for the electronic assembly 10 is to be used as well as the manufacturing processes that are used to fabricate the electronic assembly 10.

In the example form illustrated in FIGS. 1-4, the ball pad 12 includes ten lobes 13. It should be noted that the lobes 13 may be equally spaced around the circular perimeter of the ball pad 12, or not equally spaced around the circular perimeter of the ball pad 12.

Figure 5:
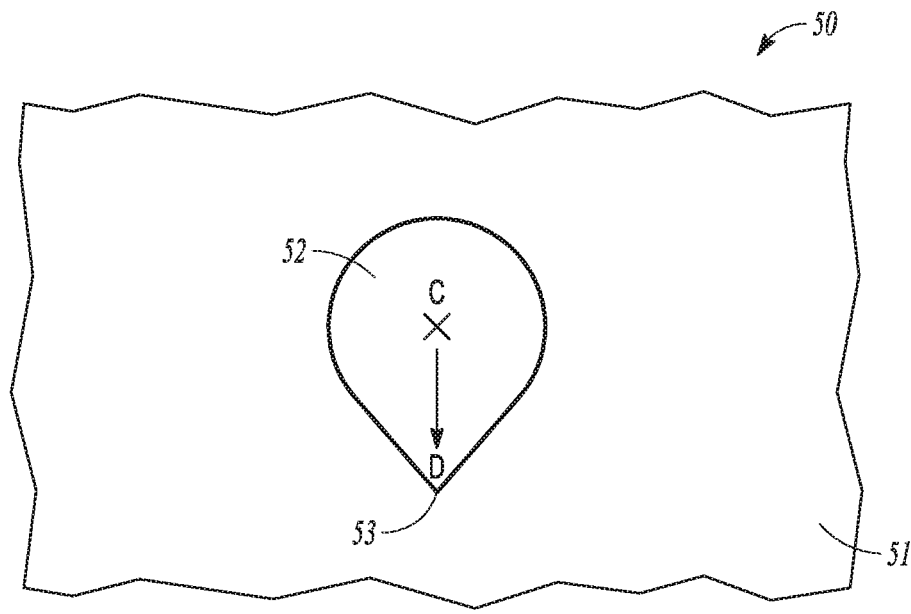
FIG. 5 is a top view illustrating another example electronic assembly that includes a substrate and a ball pad.
Figure 6:
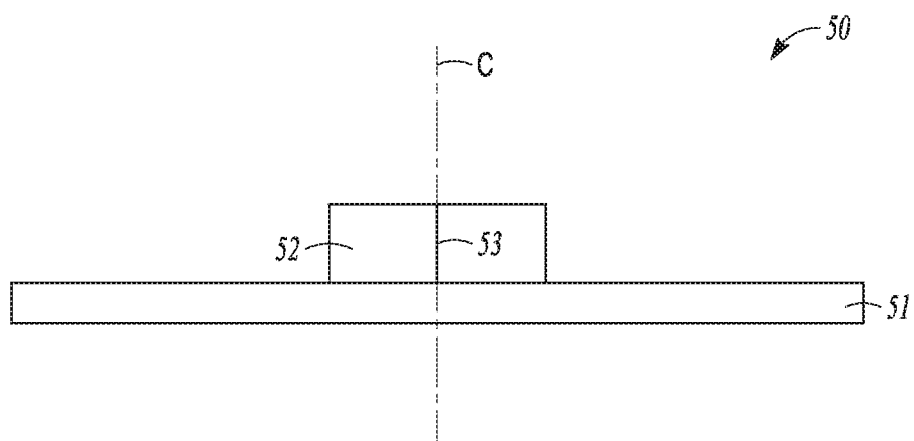
FIG. 6 is a side view of the example electronic assembly shown in FIG. 5.

FIG. 5 is a top view illustrating another example electronic assembly 50 that includes a substrate 51 and a ball pad 52. FIG. 6 is a side view of the example electronic assembly 50 shown in FIG. 5.

The electronic assembly 50 includes a substrate 51 and a ball pad 52 mounted on the substrate 51. The ball pad 52 includes a lobe 53 that projects distally D from a center C of the ball pad 52.

Figure 7:
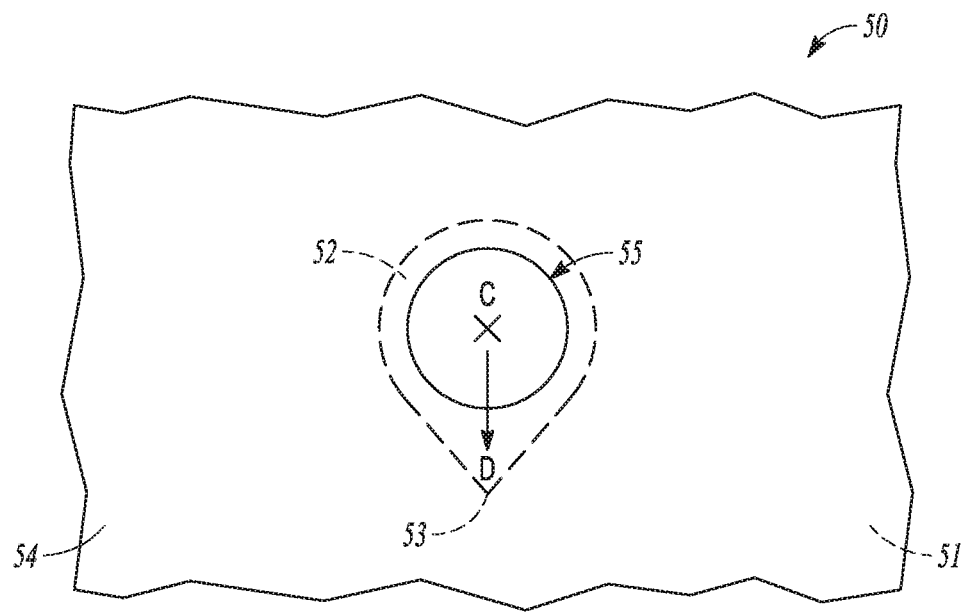
FIG. 7 is a top view of the example electronic assembly shown in FIG. 5 after a solder resist has been added.
Figure 8:
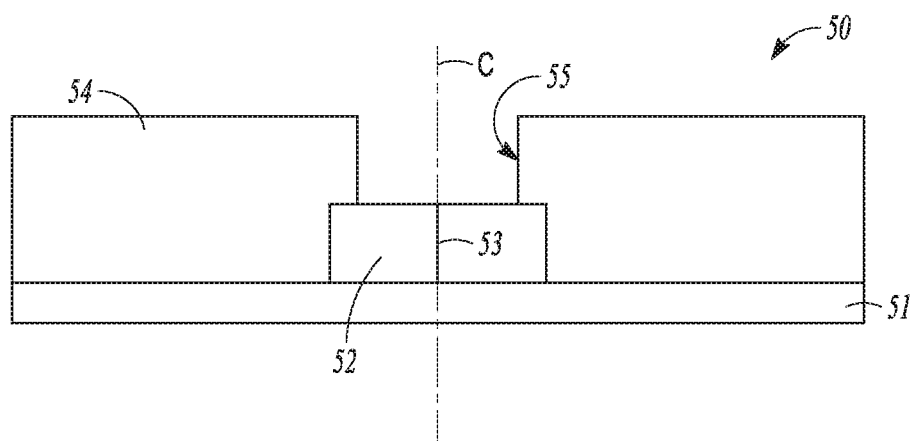
FIG. 8 is a side view of the example electronic assembly shown in FIG. 7.

As shown in FIGS. 7 and 8, the electronic assembly 50 may further include a solder resist 54 that covers the substrate 51 and a portion of the ball pad 52. The solder resist 54 includes a circular opening 55 such that the ball pad 52 is exposed through the circular opening 55.

As discussed above, the ball pad 52 may be copper (among other conductive materials). In addition, the solder resist 54 may be formed of one or more types of resin (among other types of materials).

As discussed above, the substrate 51 may be part of an electronic package or a printed circuit board. The type of substrate 51 that is included in the electronic assembly 50 will depend in part on the application where the electronic assembly 50 is to be used (among other factors).

The inclusion of lobes in the disclosed ball pads 12, 52 change the edge of the ball pads 12, 52 from a continuous circle. This changing of the ball pads 12, 52 from a continuous circle may reduce the possibility of initiating a tangential crack at the edge of the ball pads 12, 52 and therefore prevent potential substrate 11, 51 trace crack problems.

In addition, each of the lobes includes two sides that eventually join together. The two sides may join together at a point (as shown in the FIGS.), or in other forms the two sides may join together via a rounded arc (not shown in FIGS.). The angle between the sides may be less than 90 degrees (e.g., 80 degrees or less) or more than 90 degrees (e.g., more than 100 degrees).

Figure 9:
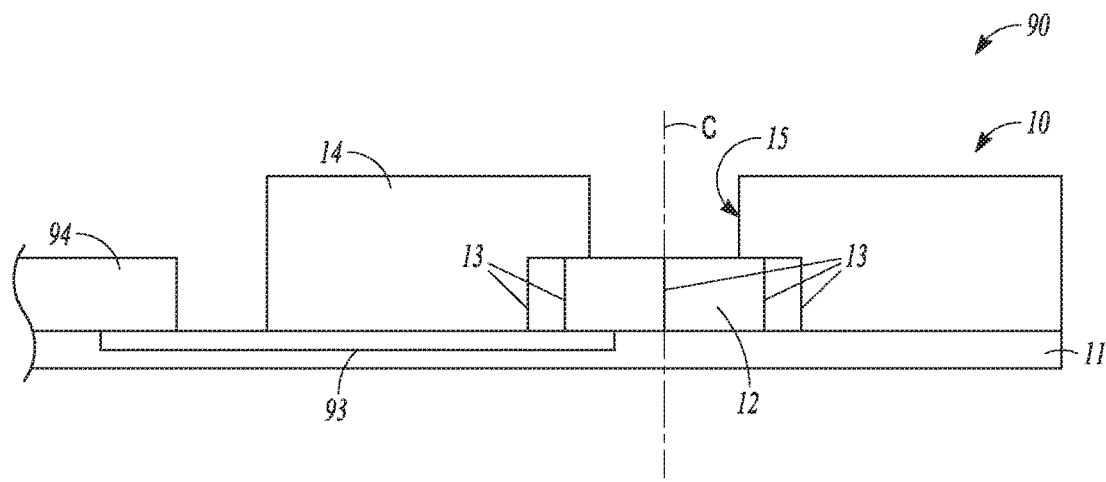
FIG. 9 is a side view of an example electronic system that includes the example electronic assembly shown in FIG. 4.
Figure 10:
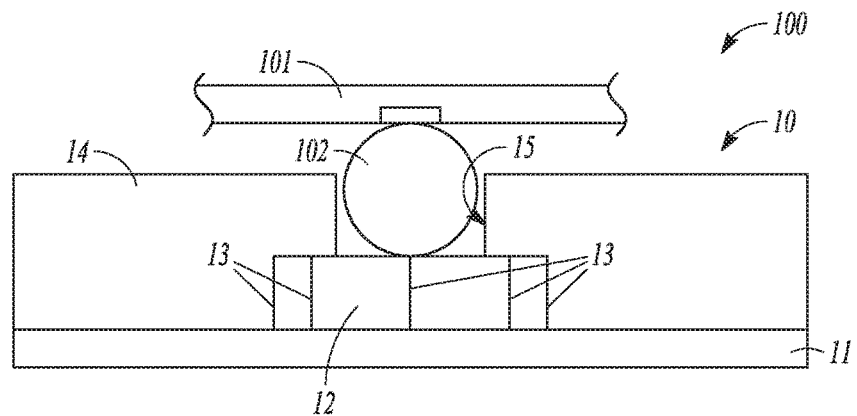
FIG. 10 is a side view of another example electronic system that includes the example electronic assembly shown in FIG. 4.

FIG. 9 is a side view of one example electronic system 90 that includes the electronic assembly 10 shown in FIG. 4. FIG. 10 is a side view of another example electronic system 100 that includes the example electronic assembly 10 shown in FIG. 4.

As shown in FIG. 9, the electronic system 90 includes a substrate 11 and a ball pad 12 mounted on the substrate 11. The ball pad 12 includes at least one lobe 13 projecting distally D from a center C of the ball pad 12.

The electronic system 90 further includes an electronic package 94. The electronic package includes at least one conductor 93 such that the ball pad 12 on the substrate 11 is electrically connected to the electronic package 94 through the conductor 93.

As discussed above, the electronic system 90 may further include a solder resist 14 that covers the substrate 11 and a portion of the ball pad 12. The solder resist 11 may be similar to any of the solder resists described above and include a circular opening 15 such that the ball pad 12 is exposed through the circular opening 15.

In the example electronic system 100 shown in FIG. 10, the electronic system 100 further includes an electronic component 101 that includes a solder ball 102. The solder ball 102 is attached to the ball pad 12 within the circular opening 15 in the solder resist 14.

It should be noted that the type of electronic component that is included in the electronic system 100 will depend in part on the application where the electronic system 100 is to be used. In addition, the electronic systems 90, 100 may include multiple ball pads and multiple electronic components that are attached to multiple ball pads depending on the overall configuration of the electronic systems 90, 100.

The lobed ball pads described herein may allow the ball grid array substrates 11, 51 that include the ball pads 12, 52 the ability to increase temperature cycling performance margin. Increasing package temperature cycling performance may be very crucial as the Z-height of electronic packages gets thinner, especially when utilizing thin core substrates.

Figure 11:
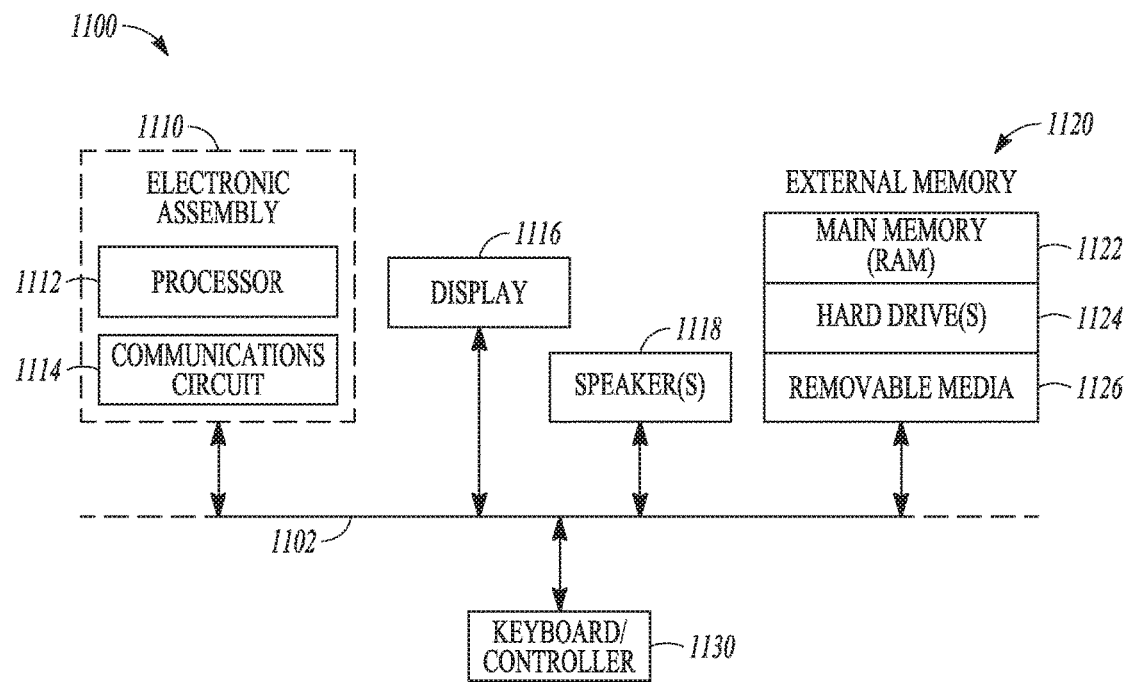
FIG. 11 is block diagram of an electronic apparatus that includes the electronic assemblies and/or the electronic systems described herein.
Figure 12:
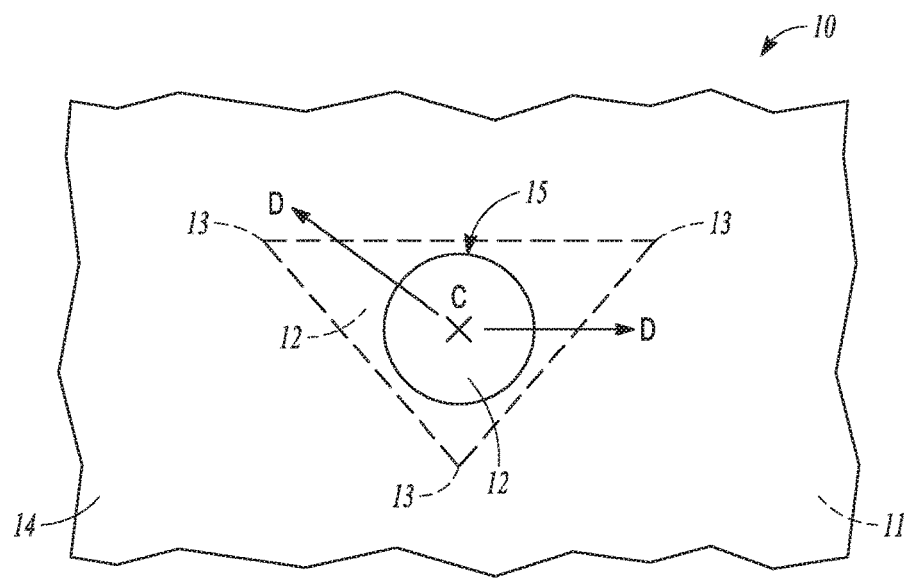
FIG. 12 is a top view illustrating another example electronic assembly that includes a substrate and a ball pad.

FIG. 11 is a block diagram of an electronic apparatus 1100 incorporating at least one of the electronic assemblies and/or electronic systems described herein. Electronic apparatus 1100 is merely one example of an electronic apparatus in which forms of the electronic assemblies and/or electronic systems described herein may be used. Examples of an electronic apparatus 1100 include, but are not limited to, personal computers, tablet computers, mobile telephones, game devices, MP3 or other digital media players, etc.

In this example, electronic apparatus 1100 comprises a data processing system that includes a system bus 1102 to couple the various components of the electronic apparatus 1100. System bus 1102 provides communications links among the various components of the electronic apparatus 1100 and may be implemented as a single bus, as a combination of busses, or in any other suitable manner.

An electronic apparatus 1100 as describe herein may be coupled to system bus 1102. The electronic apparatus 1100 may include any circuit or combination of circuits. In one embodiment, the electronic apparatus 1100 includes a processor 1112 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 1100 are a custom circuit, an application-specific integrated circuit (ASIC), or the like, such as, for example, one or more circuits (such as a communications circuit 1114) for use in wireless devices like mobile telephones, tablet computers, laptop computers, two-way radios, and similar electronic systems. The IC can perform any other type of function.

The electronic apparatus 1100 may also include an external memory 1120, which in turn may include one or more memory elements suitable to the particular application, such as a main memory 1122 in the form of random access memory (RAM), one or more hard drives 1124, and/or one or more drives that handle removable media 1126 such as compact disks (CD), flash memory cards, digital video disk (DVD), and the like.

The electronic apparatus 1100 may also include a display device 1111, one or more speakers 1118, and a keyboard and/or controller 1130, which can include a mouse, trackball, touch pad, voice-recognition device, or any other device that permits a system user to input information into and receive information from the electronic apparatus 1100.

To better illustrate the electronic assemblies and/or electronic systems disclosed herein, a non-limiting list of examples is provided herein:

Example 1 includes an electronic assembly. The electronic assembly includes a substrate; and a ball pad mounted on the substrate, wherein the ball pad includes a plurality of lobes projecting distally from a center of the ball pad.

Example 2 includes the electronic assembly of example 1, wherein the substrate is part of a printed circuit board.

Example 3 includes the electronic assembly of any one of examples 1-2, wherein the substrate is part of an electronic package.

Example 4 includes the electronic assembly of any one of examples 1-3, wherein the ball pad is copper.

Example 5 includes the electronic assembly of any one of examples 1-4, and further including a solder resist that covers the substrate and a portion of the ball pad.

Example 6 includes the electronic assembly of any one of examples 1-5, wherein the solder resist is formed of a resin.

Example 7 includes the electronic assembly of any one of examples 1-6, wherein the solder resist includes a circular opening such that the ball pad is exposed through the circular opening.

Example 8 includes the electronic assembly of any one of examples 1-7, and further including an additional conductor mounted on the ball pad within the circular opening.

Example 9 includes the electronic assembly of any one of examples 1-8, wherein the additional conductor is formed of nickel and gold.

Example 10 includes the electronic assembly of any one of examples 1-9, further comprising an organic material mounted on the ball pad within the circular opening.

Example 11 includes the electronic assembly of any one of examples 1-10, wherein the organic material is benzimidazole.

Example 12 includes the electronic assembly of any one of examples 1-11, wherein the ball pad includes 10 lobes.

Example 13 includes the electronic assembly of any one of examples 1-12, wherein the lobes are spaced equally around the circular perimeter of the ball pad.

Example 14 includes an electronic assembly. The electronic assembly includes a substrate; and a ball pad mounted on the substrate, wherein the ball pad includes a lobe projecting distally from a center of the ball pad.

Example 15 includes the electronic assembly of example 14, and further including a solder resist that covers the substrate and a portion of the ball pad, wherein the solder resist includes a circular opening such that the ball pad is exposed through the circular opening.

Example 16 includes the electronic assembly of any one of examples 14-15, wherein the ball pad is copper and the solder resist is formed of a resin.

Example 17 includes the electronic assembly of any one of examples 14-16, wherein the substrate is part of an electronic package.

Example 18 includes an electronic assembly. The electronic assembly includes a substrate; and a ball pad mounted on the substrate, wherein the ball pad includes at least one lobe projecting distally from a center of the ball pad; and an electronic package that includes at least one conductor that electrically connects the ball pad on the substrate to the electronic package.

Example 19 includes the electronic assembly of example 18, and further including a solder resist that covers the substrate and a portion of the ball pad, wherein the solder resist includes a circular opening such that the ball pad is exposed through the circular opening.

Example 20 includes the electronic assembly of any one of examples 18-19, and further including an electronic component that includes a solder ball, and wherein the solder ball is attached to the ball pad within the circular opening in the solder resist.

This overview is intended to provide non-limiting examples of the present subject matter. It is not intended to provide an exclusive or exhaustive explanation. The detailed description is included to provide further information about the methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly comprising:
   a substrate that includes a conductive trace embedded within the substrate, wherein the conductive trace is exposed to an upper exterior surface of the substrate; and
   a ball pad mounted on the upper exterior surface of the substrate, wherein the ball pad engages the conductive trace and includes a plurality of lobes projecting distally from a center of the ball pad, wherein each lobe in the plurality of lobes includes two sides that form an edge with the two sides extending from the edge at an acute angle, wherein one of the two sides in each lobe forms a planar surface with a side of another lobe and the other of the two sides forms a separate planar surface with a side of a different lobe.

2. The electronic assembly of claim 1, wherein the substrate is part of a printed circuit board.

3. The electronic assembly of claim 1, wherein the substrate is part of an electronic package.

4. The electronic assembly of claim 1, wherein the ball pad is copper.

5. The electronic assembly of claim 1, further comprising a solder resist that covers the substrate and a portion of the ball pad.

6. The electronic assembly of claim 5, wherein the solder resist is formed of a resin.

7. The electronic assembly of claim 5, wherein the solder resist includes a circular opening such that the ball pad is exposed through the circular opening.

8. The electronic assembly of claim 7, further comprising an additional conductor mounted on the ball pad within the circular opening.

9. The electronic assembly of claim 8, wherein the additional conductor is formed of nickel and gold.

10. The electronic assembly of claim 5, further comprising an organic material mounted on the ball pad within the circular opening.

11. The electronic assembly of claim 10, wherein the organic material is benzimidazole.

12. The electronic assembly of claim 1, wherein the ball pad includes 10 lobes.

13. The electronic assembly of claim 1, wherein the lobes are spaced equally around the circular perimeter of the ball pad.

14. An electronic assembly comprising
   a substrate; and
   a ball pad mounted on the substrate, wherein the ball pad includes a plurality of lobes projecting distally from a center of the ball pad, wherein the plurality of lobes each includes two side surfaces that meet and contact each other to form a common linear edge with the two side surfaces extending from the common linear edge at an acute angle, wherein one of the two surfaces in each lobe of the plurality of lobes forms a planar surface with a side of another lobe.

15. The electronic assembly of claim 14, further comprising a solder resist that covers the substrate and a portion of the ball pad, wherein the solder resist includes a circular opening such that the ball pad is exposed through the circular opening.

16. The electronic assembly of claim 15, wherein the ball pad is copper and the solder resist is formed of a resin.

17. The electronic assembly of claim 14, wherein the substrate is part of an electronic package.

18. An electronic system comprising:
   a substrate that includes a conductive trace embedded within the substrate, wherein the conductive trace is exposed to an upper exterior surface of the substrate;
   a ball pad mounted on the upper exterior surface of the substrate, wherein the ball pad engages the conductive trace and includes a plurality of lobes projecting distally from a center of the ball pad, wherein each lobe includes two side surfaces that meet and contact each other to form a common linear edge with the two side surfaces extending from the edge at an acute angle, wherein one of the two surfaces in each lobe of the plurality of lobes forms a planar surface with a side of another lobe and the other of the two sides forms a separate planar surface with a side of a different lobe; and
   an electronic package that includes at least one conductor that electrically connects the ball pad on the substrate to the electronic package.

19. The electronic system of claim 18, further comprising a solder resist that covers the substrate and a portion of the ball pad, wherein the solder resist includes a circular opening such that the ball pad is exposed through the circular opening.

20. The electronic system of claim 19; further comprising an electronic component that includes a solder ball, wherein the solder ball is attached to the ball pad within the circular opening in the solder resist.

* * * * *